(12) United States Patent
Lenhardt et al.

(10) Patent No.: US 10,903,118 B2
(45) Date of Patent: Jan. 26, 2021

(54) CHAMFERLESS VIA STRUCTURES

(71) Applicant: INTERNATIONAL BUSINESS MACHINES CORPORATION, Armonk, NY (US)

(72) Inventors: Mark L. Lenhardt, Schenectady, NY (US); Frank W. Mont, Troy, NY (US); Brown C. Peethala, Slingerlands, NY (US); Shariq Siddiqui, Delmar, NY (US); Jessica P. Striss, Schenectady, NY (US); Douglas M. Trickett, Altamont, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/503,683

(22) Filed: Jul. 5, 2019

(65) Prior Publication Data
US 2019/0333813 A1   Oct. 31, 2019

Related U.S. Application Data

(63) Continuation of application No. 15/982,076, filed on May 17, 2018, now Pat. No. 10,388,565, which is a
(Continued)

(51) Int. Cl.
*H01L 21/768* (2006.01)
*H01L 23/522* (2006.01)
(Continued)

(52) U.S. Cl.
CPC .. *H01L 21/76897* (2013.01); *H01L 21/31144* (2013.01); *H01L 21/76802* (2013.01);
(Continued)

(58) Field of Classification Search
None
See application file for complete search history.

(56) References Cited

U.S. PATENT DOCUMENTS

| 6,387,798 | B1 | 5/2002 | Loke et al. |
| 6,649,464 | B2 | 11/2003 | Lee |

(Continued)

FOREIGN PATENT DOCUMENTS

| KR | 1020010063516 | 7/2001 |
| KR | 1020040057580 | 7/2004 |
| KR | 1020100076457 | 7/2010 |

OTHER PUBLICATIONS

"List of IBM Patents or Patent Applications Treated as Related", dated Jul. 3, 2019, 1 page.
(Continued)

*Primary Examiner* — Reema Patel
*Assistant Examiner* — Steven M Christopher
(74) *Attorney, Agent, or Firm* — L. Jeffrey Kelly; Andrew M. Calderon; Roberts Calderon Safran & Cole, P.C.

(57) ABSTRACT

Chamferless via structures and methods of manufacture are provided. The method includes: forming at least one non-self-aligned via within at least dielectric material; plugging the at least one non-self-aligned via with material; forming a protective sacrificial mask over the material which plugs the at least one non-self-aligned via, after a recessing process; forming at least one trench within the dielectric material, with the protective sacrificial mask protecting the material during the trench formation; removing the protective sacrificial mask and the material within the at least one non-self-aligned via to form a wiring via; and filling the wiring via and the at least one trench with conductive material.

19 Claims, 6 Drawing Sheets

Related U.S. Application Data continuation of application No. 15/412,784, filed on Jan. 23, 2017, now Pat. No. 10,032,688, which is a continuation of application No. 14/843,109, filed on Sep. 2, 2015, now Pat. No. 9,613,862.

(51) Int. Cl.
*H01L 23/528* (2006.01)
*H01L 21/311* (2006.01)

(52) U.S. Cl.
CPC .. *H01L 21/76804* (2013.01); *H01L 21/76808* (2013.01); *H01L 21/76811* (2013.01); *H01L 21/76814* (2013.01); *H01L 21/76829* (2013.01); *H01L 21/76879* (2013.01); *H01L 23/528* (2013.01); *H01L 23/5226* (2013.01)

(56) References Cited

U.S. PATENT DOCUMENTS

| | | | |
|---|---|---|---|
| 6,734,489 B2 | 5/2004 | Morimoto et al. | |
| 7,205,232 B2 | 4/2007 | Yun et al. | |
| 7,439,151 B2 | 10/2008 | Coolbaugh et al. | |
| 7,777,344 B2 | 8/2010 | Lee et al. | |
| 8,623,735 B2 | 1/2014 | Lee et al. | |
| 9,373,680 B1 | 6/2016 | Lee et al. | |
| 9,613,862 B2 | 4/2017 | Lenhardt et al. | |
| 10,032,668 B2 | 7/2018 | Lenhardt et al. | |
| 2002/0173152 A1 | 11/2002 | Chen et al. | |
| 2005/0153505 A1 | 7/2005 | Gambino et al. | |
| 2006/0160353 A1 | 7/2006 | Gueneau De Mussy et al. | |
| 2014/0098459 A1* | 4/2014 | Lee ............ H01L 27/10805 361/306.1 | |
| 2014/0167268 A1 | 6/2014 | Bao et al. | |
| 2015/0091181 A1 | 4/2015 | Li et al. | |
| 2015/0187697 A1 | 7/2015 | Kuo et al. | |
| 2015/0287675 A1* | 10/2015 | Shaviv ............ H01L 23/5226 257/774 |
| 2015/0325483 A1 | 11/2015 | Tran et al. | |
| 2015/0364420 A1 | 12/2015 | Lin et al. | |
| 2017/0062331 A1 | 3/2017 | Lenhardt et al. | |
| 2017/0098606 A1 | 4/2017 | Lu et al. | |
| 2017/0133268 A1 | 5/2017 | Lenhardt et al. | |
| 2018/0269103 A1 | 9/2018 | Lenhardt et al. | |

OTHER PUBLICATIONS

Specification "Chamferless Via Structures" and Drawings in U.S. Appl. No. 16/503,706, filed Jul. 5, 2019, 21 pages.

"List of IBM Patents or Patent Applications Treated as Related", dated Jul. 26, 2019, 1 page.

Office Action in related U.S. Appl. No. 15/333,874 dated Nov. 6, 2019, 16 pages.

Office Action dated Mar. 2, 2020 in related U.S. Appl. No. 16/503,706, 13 pages.

Office Action dated Mar. 3, 2020 in related U.S. Appl. No. 15/333,874, 21 pages.

Final Office Action dated Jun. 9, 2020 in related U.S. Appl. No. 16/503,706, 18 pages.

Office Action dated Jun. 16, 2020 in related U.S. Appl. No. 15/333,874, 19 pages.

Notice of Allowance dated Oct. 9, 2020 in related U.S. Appl. No. 16/503,706, 8 pages.

Notice of Allowance dated Nov. 6, 2020 in related U.S. Appl. No. 15/333,874, 13 pages.

* cited by examiner

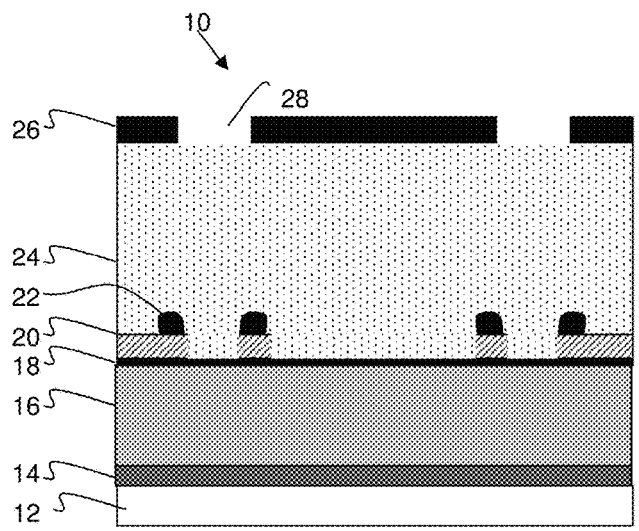
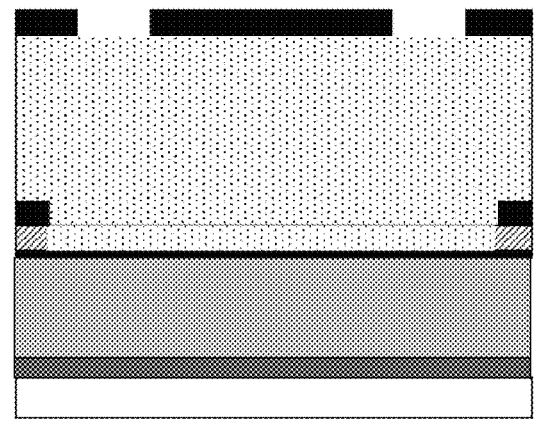
FIG. 1A
FIG. 1B
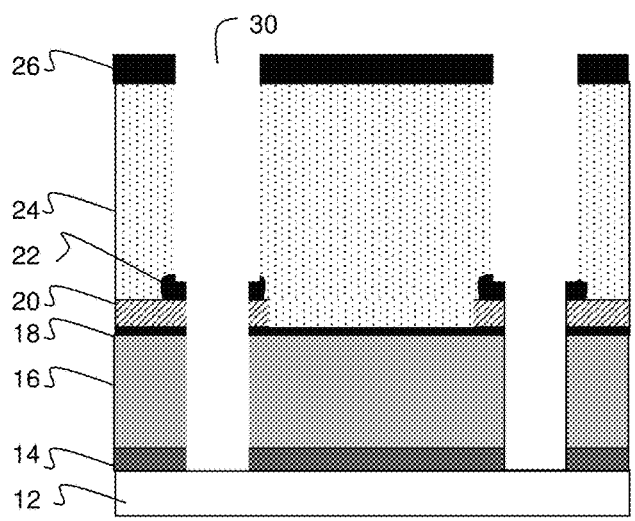
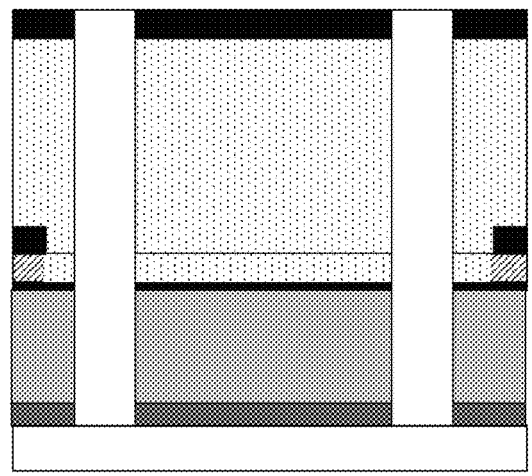
FIG. 2A
FIG. 2B

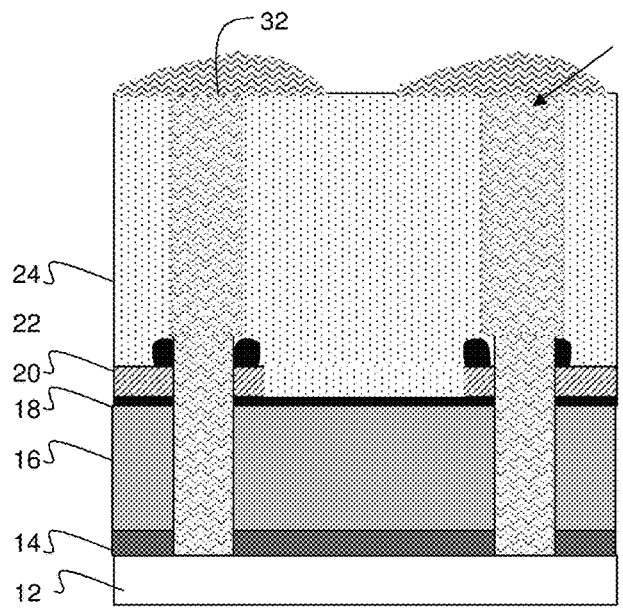
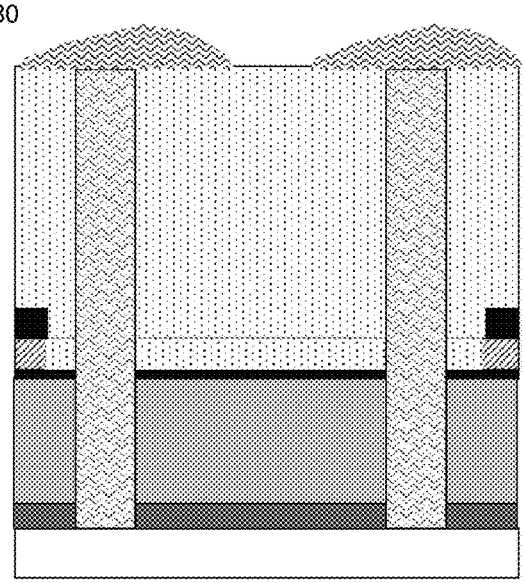
FIG. 3A  FIG. 3B
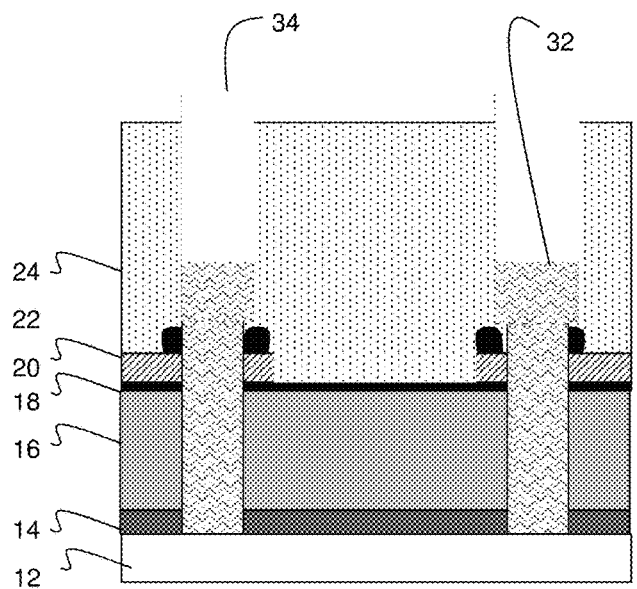
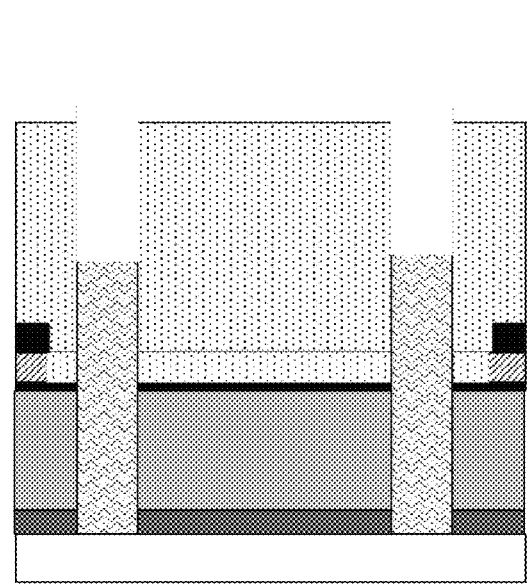
FIG. 4A  FIG. 4B

US 10,903,118 B2

CHAMFERLESS VIA STRUCTURES

FIELD OF THE INVENTION

The invention relates to semiconductor structures and, more particularly, to chamferless via structures and methods of manufacture.

BACKGROUND

Integrated circuit(s) typically include a plurality of semiconductor devices and interconnect wiring. Networks of metal interconnect wiring typically connect the semiconductor devices from a semiconductor portion of a semiconductor substrate. Multiple levels of metal interconnect wiring above the semiconductor portion of the semiconductor substrate are connected together to form a back-end-of-the line (BEOL) interconnect structure.

Several developments have contributed to increased performance of contemporary ICs. One such development is technology scaling which results in higher integration of structures, e.g., transistors, wiring, etc. However, technology scaling has posed several challenges including, e.g., process variation, stricter design rules, etc. For example, in trench first via last metal hardmask integration schemes, excessive non-self-aligned via (Non-SAV) chamfering can result during trench formation. This integration scheme results in chamfering which is very difficult to control, and can result in poor yields, jagged surfaces and shorting issues.

SUMMARY

In an aspect of the invention, a method comprises: forming at least one self-aligned via within at least dielectric material; plugging the at least one self-aligned via with material; forming a protective sacrificial mask over the material which plugs the at least one self-aligned via, after a recessing process; forming at least one trench within the dielectric material, with the protective sacrificial mask protecting the material during the trench formation; removing the protective sacrificial mask and the material within the at least one self-aligned via to form a wiring via; and filling the wiring via and the at least one trench with conductive material.

In an aspect of the invention, a method comprises: forming at least one self-aligned via within an optical planar layer and ultra low-k dielectric material; plugging the at least one self-aligned via with material selective to the ultra low-k dielectric material; recessing the material; removing the optical planar layer and underlying etch stop material to expose the ultra low-k dielectric material, wherein the removing step further recesses the material to below spacers formed above the ultra low-k dielectric material; forming a protective sacrificial mask over the material which plugs the at least one self-aligned via; forming at least one trench within the dielectric material, with the protective sacrificial mask protecting the material during the forming of the at least one trench; removing the protective sacrificial mask and the material within the at least one self-aligned via to form a wiring via; and filling the wiring via and the at least one trench with conductive material.

In an aspect of the invention, a structure comprises a conductive line and via formed in a low-k dielectric material wherein the via is chamferless and the low-k dielectric material is continuous with no etch stop layer at a line/via junction.

BRIEF DESCRIPTION OF THE DRAWINGS

The present invention is described in the detailed description which follows, in reference to the noted plurality of drawings by way of non-limiting examples of exemplary embodiments of the present invention.

Prior to discussing the particulars of each of the figures, it is to be noted that each set of figures include a cross sectional view of a structure along a self-aligned via (SAV) direction, e.g., FIGS. 1A, 2A, 3A, 4A, 5A, 6A, 7A, 8A, 9A and 10A, and a set of figures including a cross sectional view of a structure along a non-self-aligned via (non-SAV) direction, e.g., FIGS. 1B, 2B, 3B, 4B, 5B, 6B, 7B, 8B, 9B and 10B.

FIG. 1A shows a cross sectional view of a beginning structure and respective fabrication processes along a self-aligned via (SAV) direction; whereas, FIG. 1B shows a cross sectional view of the structure of FIG. 1A along a non-SAV direction, in accordance with aspects of the invention.

FIGS. 2A and 2B show structures with openings and respective fabrication processes in accordance with aspects of the invention.

FIGS. 3A and 3B show structures with via fill material within the openings and respective fabrication processes in accordance with aspects of the invention.

FIGS. 4A and 4B show the via fill material recessed within the openings and respective fabrication processes in accordance with aspects of the invention.

DETAILED DESCRIPTION

Figures 5A, 5B:
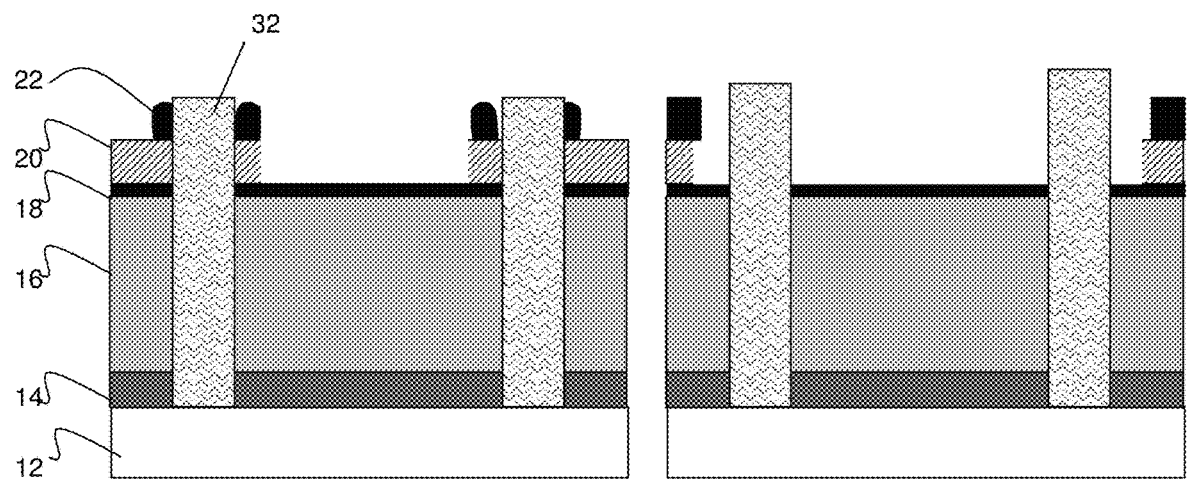
FIGS. 5A and 5B show additional structures within the fabrication processes, and respective fabrication processes in accordance with aspects of the invention.

The invention relates to semiconductor structures and, more particularly, to chamferless via structures and methods of manufacture. In embodiments, the present invention implements a protective sacrificial mask, e.g., Ruthinium, in order to protect a via structure during back end of the line (BEOL) processing. In embodiments, the Ruthinium or other protective sacrificial mask material described herein will protect gap fill material and underlying materials, e.g., Titanium Nitride (TiN) hardmask, during trench interlevel dielectric (ILD) reactive ion etching (RIE) processes. The protection provided by the protective sacrificial mask will reduce via CD (critical dimension) increase and improve non-SAV (self-aligned via) angle and chamfer roughness caused by ILD damage caused during the trench ILD RIE process. In this way, the processes of the present invention can be used to form a chamferless via structure.

In embodiments, the fabrication processes include making a chamferless via structure of a dual damascene line/via formed in an ultra-low k dielectric material. In more specific embodiments, the fabrication processes include, amongst other steps, using a gap fill material (e.g., SiARC) in a via opening etched in a low-k dielectric material, while trench openings are subsequently formed in the low-k dielectric material. In embodiments, the gap fill material can be protected with selectively formed Ruthenium, which is used as a mask during trench opening formation processes. Advantageously, the processes described herein will result in final wiring structures comprising a dual damascene line and via formed in a low-k dielectric wherein the via is chamferless and the low-k dielectric material is continuous (e.g., there is no intermediate etch stop layer at the dual damascene line/via junction).

The chamferless via structures of the present invention can be manufactured in a number of ways using a number of different tools. In general, though, the methodologies and tools are used to form structures with dimensions in the micrometer and nanometer scale. The methodologies, i.e., technologies, employed to manufacture the chamferless via structures of the present invention have been adopted from integrated circuit (IC) technology. For example, the structures of the present invention are built on wafers and are realized in films of material patterned by photolithographic processes on the top of a wafer. In particular, the fabrication of the chamferless via structures of the present invention uses three basic building blocks: (i) deposition of thin films of material on a substrate, (ii) applying a patterned mask on top of the films by photolithographic imaging, and (iii) etching the films selectively to the mask.

Now referring to the figures, as shown in FIGS. 1A and 1B, the structure 10 includes a metal layer 12, e.g., copper or tungsten, amongst other metal or metal alloys. A block material 14 such as an NBLOK is formed on the metal layer 12. In embodiments, the block material 14 can be about 20 nm in depth, although other dimensions are contemplated by the present invention. A dielectric material 16 is formed on the block material 14. In embodiments, the dielectric material 16 is an ultra low-k dielectric material known to those of ordinary skill in the art. The dielectric material 16 can be formed to a thickness of about 100 nm; although other dimensions are also contemplated by the present invention.

Still referring to FIGS. 1A and 1B, a thin film of etch stop layer or hardmask material 18, e.g., alloy material, is deposited on the dielectric material 16. In embodiments, the thin film of etch stop layer or hardmask material 18 can be SiNH deposited to a thickness of about 10 nm; although other dimensions are also contemplated by the present invention. Another hardmask 20, e.g., TiN, is deposited on the thin film of etch stop layer or hardmask material 18, followed by the formation of spacers 22, e.g., nitride material. The hardmask 20 and spacers 22 can be formed using conventional deposition processes, e.g., CVD, followed by lithography and etching, e.g., RIE, processes known to those of ordinary skill in the art such that further description is not required for an understanding of the invention. The lithography and etching process will result in a self-aligned via structure as described herein.

Still referring to FIGS. 1A and 1B, an optical planarization layer (OPL) 24 can be deposited over the structure, e.g., hardmask 20 and spacers 22 and exposed portions of the thin film of etch stop layer or hardmask 18. In embodiments, the OPL 24 can be spun on and baked, or can be deposited by CVD. OPL can be baked at lower temperatures, such as 150-200° C. to avoid damaging any other materials. A hardmask 26 is deposited on the OPL 24. In embodiments, the hardmask 26 is a low temperature oxide deposited to a thickness of about 30 nm; although other dimensions are also contemplated by the present invention.

The hardmask 26 is patterned to form openings 28. In embodiments, the openings 28 are formed by conventional lithography and etching processes. For example, a resist is formed over the hardmask 26, which is exposed to energy (light) to form a pattern (openings). A reactive ion etching (RIE) process is at performed through the openings of the resist to fort the openings 28 in the hardmask 26. The resist is then removed using conventional stripants or oxygen ashing processes.

As shown in FIGS. 2A and 2B, openings 30 (e.g., self-aligned via structures 30), are formed in the materials to the underlying metal layer 12. As shown in FIG. 2A, the self-aligned via structures 30 extend between the spacers 22 and the hardmask 20, and expose the underlying metal layer 12. The self-aligned via structures 30 can be formed through several selective etch chemistries, selective for each of the materials. The different chemistries will be selective to different materials as should be known to those of ordinary skill in the art such that further description is not required for an understanding of the invention.

In embodiments, the different etching steps can be provided within the same etch chamber, as an example. For example, a first etch chemistry is used to remove portions of the OPL 24. A second etch chemistry is then used to remove the etch stop layer 18, with subsequent etch chemistries used to remove the dielectric layer 16 and hardmask layer 14, respectively. In this way, the underlying metal layer 12 can be exposed.

In embodiments, the self-aligned via structures 30 can undergo a wet etching process to remove any residual RIE residue to improve fill adhesion. In embodiments, the self-aligned via structures 30 can have an aspect ratio of, e.g., about 15:1. For example, in embodiments, the dimensions of the self-aligned via structures 30 in the SAV direction can be about 20 nm, whereas, the dimensions of the self-aligned via structures 30 in the non-SAV direction can be about 30 nm.

In FIGS. 3A and 3B, a via fill material 32 is deposited within the self-aligned via structures 30. During this deposition process, residual via fill material 32 may form on the surface of the OPL 24. In embodiments, the via fill material 32 can be SiARC (e.g., antireflective coating of Si). In alternate embodiments, the via fill material 32 can be an OPL. In still additional alternate embodiments, the via fill material 32 can be a spin on material, e.g., spin on glass. In still additional alternate embodiments, the via fill material 32 can be an oxide such as an ultra porous material, e.g., ultra low-k dielectric material such as SiCOH.

In embodiments, the via fill material 32 should have a viscosity that allows complete fill of the self-aligned via structures 30. In alternate embodiments, the via fill material 32 may not completely fill the self-aligned via structures 30. For example, air gaps can be provided below the etch stop layer 18, e.g., at the dielectric layer 16. In embodiments, the via fill material 32 does not need to be planarized or conform to photolithography specifications.

In FIGS. 4A and 4B, the via fill material 32 is etched slightly to form recesses 34 within the OPL 24. In embodiments, the recesses 34 can be tuned to specific dimensions based on etch rates and chemistries. Following the recess of the via fill material 32, the OPL material and additional portions of the via fill material 32 are removed as shown in FIGS. 5A and 5B. These materials can be removed by selective etching chemistries as described herein.

Figures 6A, 6B:
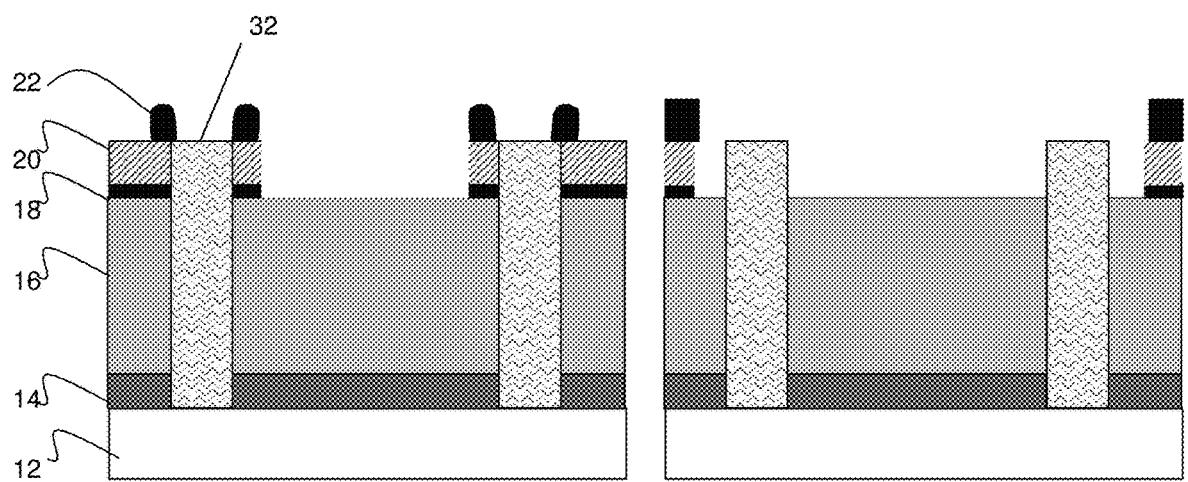
FIGS. 6A and 6B show additional structures within the fabrication processes, and respective fabrication processes in accordance with aspects of the invention.

In FIGS. 6A and 6B, any exposed etch stop layer material 18 can be removed using a selective etch chemistry. This selective etch chemistry can also remove portions of the via fill material 32 to below the spacers 22. In embodiments, the removal of the etch stop layer material 18 will allow the formation of a trench structure in subsequent fabrication processes.

Figures 7A, 7B:
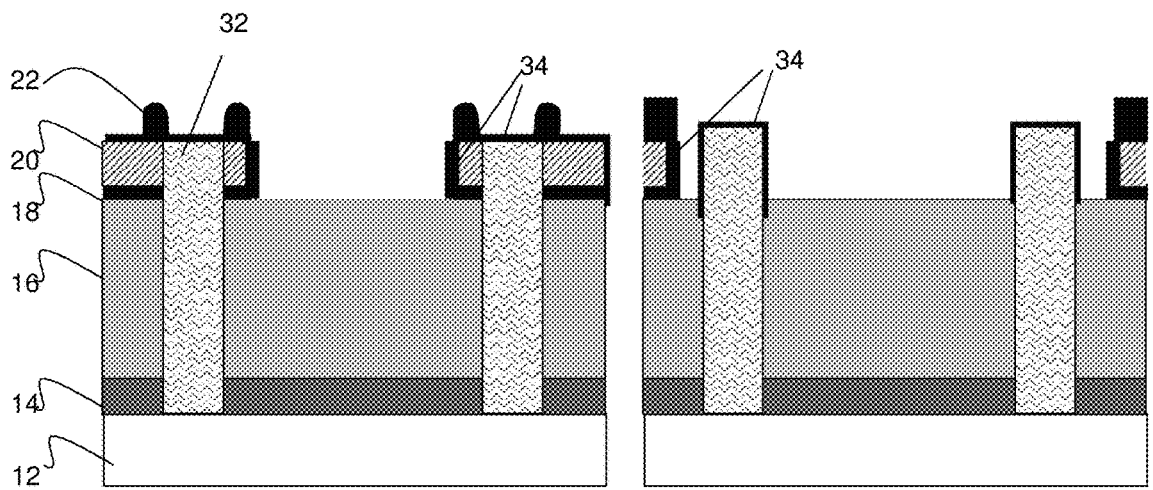
FIGS. 7A and 7B shows a protective sacrificial mask on exposed portions of the via fill material amongst other structures, and respective fabrication processes in accordance with aspects of the invention.

In FIGS. 7A and 7B, a protective sacrificial mask 34 is formed on the exposed portions of the via fill material 32. The protective sacrificial mask 34 can also be formed on exposed portions of the etch stop layer 18 and hardmask 20. In embodiments, the protective sacrificial mask 34 is a selective deposition material, which does not deposit or adhere to oxide, e.g., dielectric material 16. In this way, the dielectric material 16 remains exposed for future trench formation processing.

By way of example and as discovered by the inventors, the protective sacrificial mask 34 can be Ruthinium. Advantageously, Ruthinium does not adhere to oxide, dielectric material 16, but will adhere to organics and metals. Also, Ruthinium has been found to be resistant to etch chemistries used for trench formation processes. In embodiments, the protective sacrificial mask 34 can be formed by an atomic layer deposition (ALD) process, controllable to 1 nm.

Figures 8A, 8B:
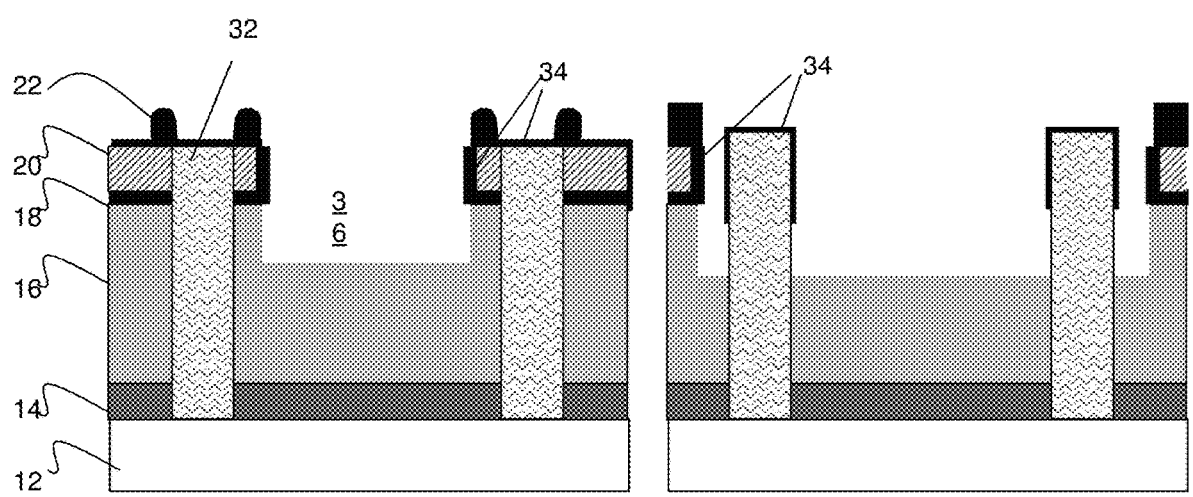
FIGS. 8A and 8B show a plurality of trenches within dielectric material, and respective fabrication processes in accordance with aspects of the invention.

As shown in FIGS. 8A and 8B, the exposed dielectric material 16 undergoes etching processes to form a trench 36. In embodiments, the protective sacrificial mask 34 will protect the underlying materials and, more specifically, the self-aligned via structures 30. In this way, the self-aligned via structures 30 will not become damaged during processing of the trenches 36. The trenches 36 can have a depth of about 60 nm to about 80 nm; although other dimensions are also contemplated by the present invention.

Figures 9A, 9B:
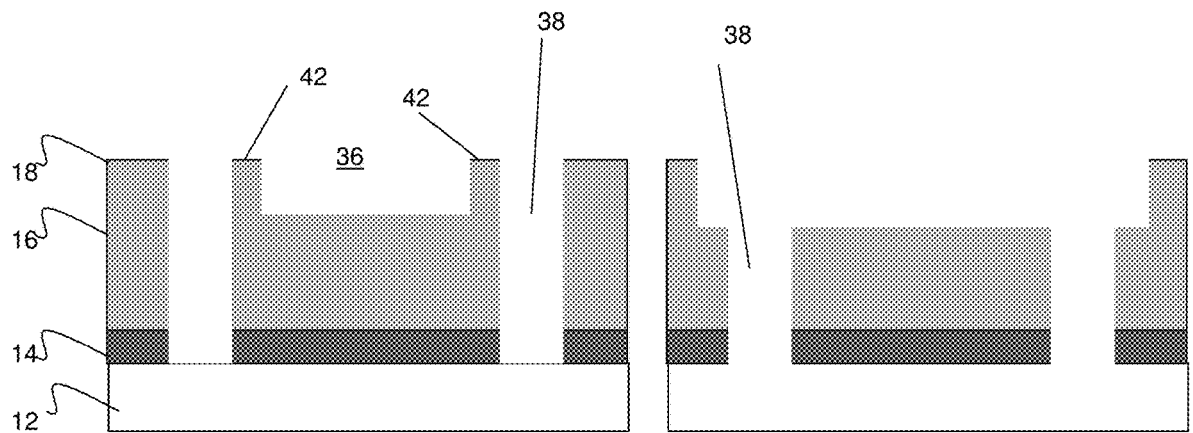
FIGS. 9A and 9B show chamferless wiring vias, and respective fabrication processes in accordance with aspects of the invention.

As shown in FIGS. 9A and 9B, the protective sacrificial mask 34, the etch stop layer 18 and hardmask 20 can be removed, followed by removal of the via fill material 32. In embodiments, the via fill material 32 will protect the underlying metal layer 12 during the removal of the protective sacrificial mask 34, etch stop layer 18 and hardmask 20, allowing for aggressive removal of the etch stop layer 18 and hardmask 20. In embodiments, the protective sacrificial mask 34, etch stop layer 18 and hardmask 20 can be removed using a wet etch process. Moreover, in embodiments, the via fill material 32 can be removed by a dry or wet etch removal process. In embodiments, the via fill material 32 can also be removed with the removal of the etch stop layer 18 and/or hardmask 20. In any scenario, the removal of the via fill material 32 will form a wiring via 38 with vertical sidewalls, e.g., chamferless sidewalls. By way of example, the sidewall angle would be greater than 85°, and preferably has a constant angle in the dielectric material 16. In this way, the wiring via 38 would be chamferless.

Figures 10A, 10B:
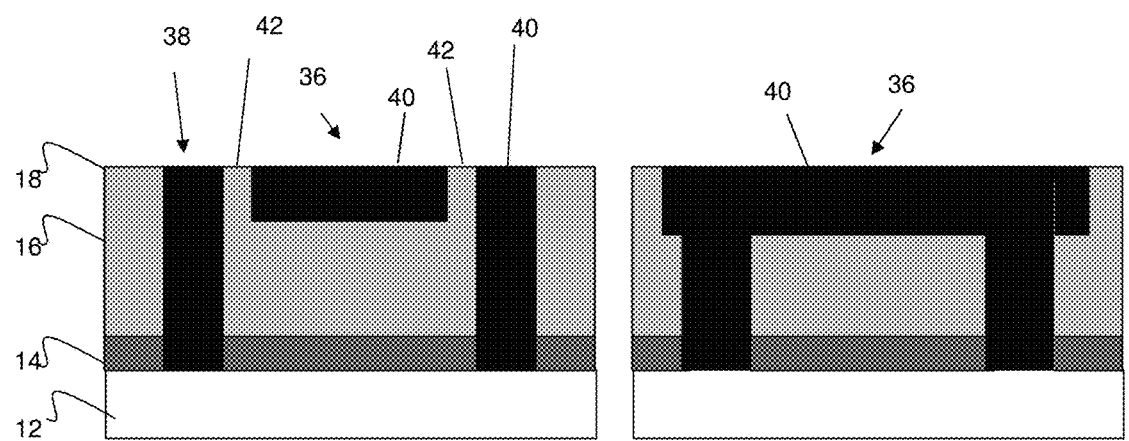
FIGS. 10A and 10B show metal fill material within the chamferless wiring vias (wiring lines), and respective fabrication processes in accordance with aspects of the invention.

As shown in FIGS. 10A and 10B, metal fill material 40 is formed within the wiring via 38 and the trench 36. The metal fill material 40 can be a copper material formed by an electroplating process as is well known to those of skill in the art. In embodiments, prior to the metal fill process, any residual RIE material can be cleaned from the wiring via 38 and the trenches 36 using a wet etch process, followed by deposition of a barrier and seed layer. The barrier layer can prevent metal diffusion into the ultra-low-k dielectric and it can promote seed layer adhesion. After the deposition of a barrier and seed layer, the electroplating process can commence to form metal lines, e.g., metal fill material 40. Any residual metal fill material 40 on a surface of the structure can be removed by a conventional planarization process, e.g., chemical mechanical polishing (CMP).

Figure 11A:
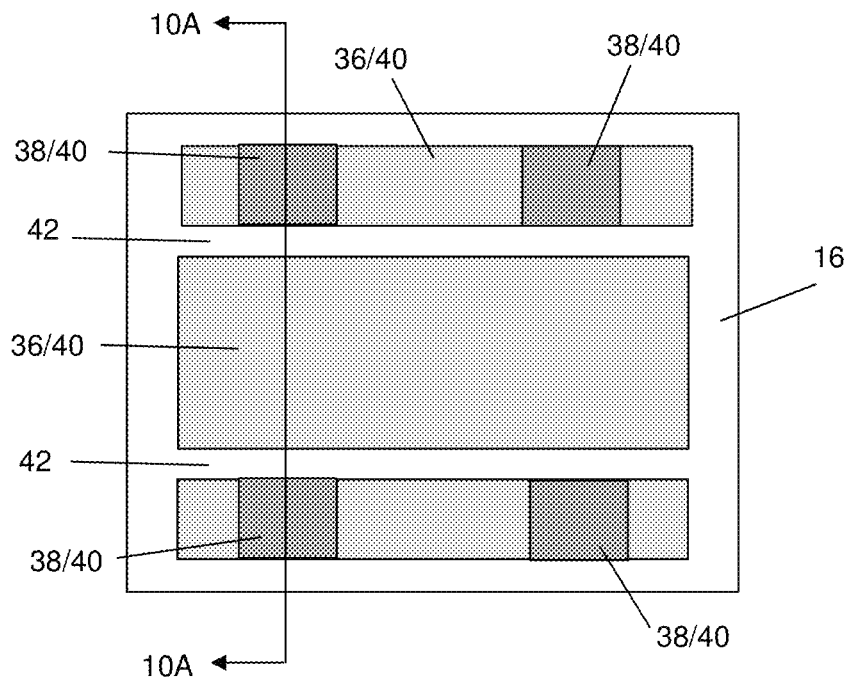
FIG. 11A shows a top view of FIG. 10A.

FIG. 11A shows a top view of FIG. 10A. As such, FIG. 10A shows a cross-sectional view taken along the lines 10A-10A of FIG. 11A. Line 10A-10A of FIG. 11A is the SAV direction described above, which shows a pair of the vias 38 in the SAV direction in FIG. 10A. More specifically, in FIG. 11A, the SAV direction line 10A-10A cuts through the vias 38 in the SAV direction 10A-10A to show the view of FIG. 10A with the metal fill material 40 formed in both the self-aligned vias 38 and the trench 36. Ridges 42 of the dielectric layer 16 are shown in FIGS. 9A, 10A and 11A separating the metal fill material 40 filling the self-aligned vias 38 from the metal fill material 40 filling the trench 36.

Figure 11B:
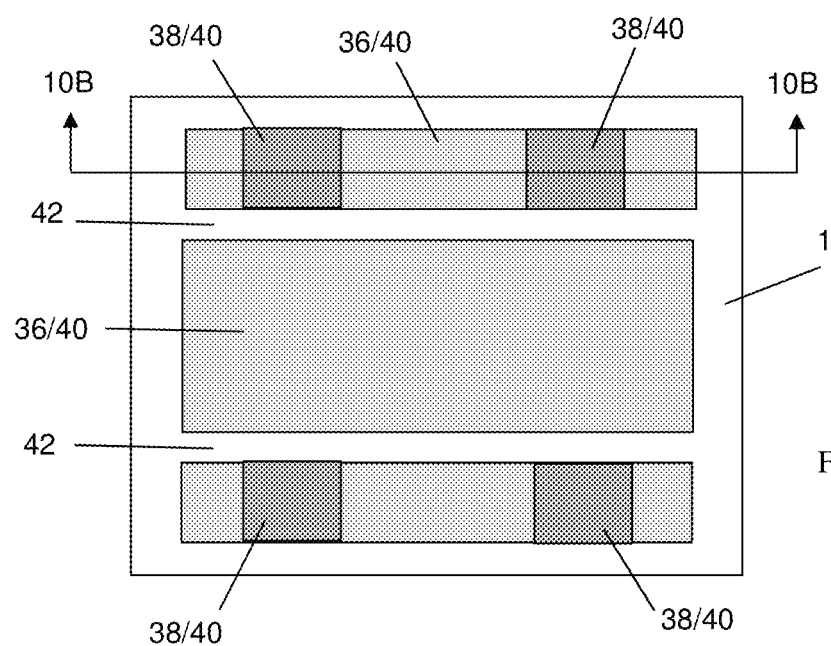
FIG. 11B shows a top view of FIG. 10B.

FIG. 11B, on the other hand, shows a top view of FIG. 10B taken along a non-SAV direction, shown in FIG. 11B as the direction 10B-10B. Specifically, FIG. 11B shows the vias 38 from the direction 10B-10B in which the vias 38 are not self-aligned.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor structure, comprising:
   a non-self-aligned via within a dielectric material, the non-self-aligned via being chamferless and being a wiring via;
   a trench within the dielectric material; and
   a conductive material filling the wiring via and the trench to form a conductive line in the trench,
   wherein the trench extends over a top of the wiring via, and
   wherein the conductive material filling the trench extends over an upper surface of the conductive material filling the wiring via,
   wherein the dielectric material is a low-k dielectric material which is continuous with no etch stop layer at a conductive line/via junction.

2. The semiconductor structure of claim 1, wherein the dielectric material is an ultra low-k material.

3. A semiconductor structure, comprising:
a non-self-aligned via within a dielectric material, the non-self-aligned via being chamferless and being a wiring via;
a trench within the dielectric material;
a conductive material filling the wiring via and the trench, wherein the trench extends over a top of the wiring via, wherein the conductive material filling the trench extends over an upper surface of the conductive material filling the wiring via, and
wherein the non-self-aligned via is within an optical planarization layer above the dielectric material.

4. The semiconductor structure of claim 1, wherein the wiring via has sidewalls at a sidewall angle greater than 85°.

5. The semiconductor structure of claim 1, further comprising a block material and a metal layer.

6. The semiconductor structure of claim 5, wherein the dielectric material is directly on and contacting the block material.

7. The semiconductor structure of claim 6, wherein the block material is directly on and contacting the metal layer.

8. The semiconductor structure of claim 7, wherein:
the metal layer is one of copper and tungsten; and
the dielectric material is an ultra low-k material.

9. The semiconductor structure of claim 8, wherein the non-self-aligned via extends completely through the block material.

10. The semiconductor structure of claim 9, wherein the non-self-aligned via stops at the metal layer.

11. The semiconductor structure of claim 5, wherein the non-self-aligned via extends completely through the block material.

12. The semiconductor structure of claim 11, wherein the non-self-aligned via stops at the metal layer.

13. The semiconductor structure of claim 1, wherein the trench extends completely over the top of the wiring via and over an upper surface of the dielectric material surrounding the top of the wiring via, and wherein the conductive material filling the trench completely covers the upper surface of the conductive material filling the wiring via and covers the upper surface of the dielectric material surrounding the top of the wiring via.

14. The semiconductor structure of claim 1, further comprising a second wiring via in the dielectric material, wherein the trench extends between the wiring via and the second wiring via, and wherein the conductive material filling the trench extends over an upper surface of conductive material filling the second wiring via.

15. The semiconductor structure of claim 14, wherein the trench extends over the top of the wiring via and a top of the second wiring via, and over an upper surface of the dielectric material surrounding the tops of the wiring via and the second wiring via, and wherein the conductive material filling the trench completely covers upper surfaces of the conductive material filling the wiring via and the second wiring via, and extends over the upper surface of the dielectric material surrounding the top of the wiring via and the second wiring via.

16. The semiconductor structure of claim 15, wherein the wiring via has sidewalls at a sidewall angle greater than 85°.

17. The semiconductor structure of claim 16, further comprising a block material and a metal layer underlying the blocking layer and the conductive material, wherein the dielectric material is directly on and contacting the block material, and wherein the block material is directly on and contacting the metal layer.

18. The semiconductor structure of claim 17, wherein:
the metal layer is one of copper and tungsten; and
the dielectric material is an ultra low-k material.

19. A semiconductor structure, comprising:
a non-self-aligned via within a dielectric material, the non-self-aligned via being chamferless and being a wiring via;
a trench within the dielectric material;
a conductive material filling the wiring via and the trench, wherein the trench extends over a top of the wiring via, wherein the conductive material filling the trench extends over an upper surface of the conductive material filling the wiring via,
further comprising a second wiring via in the dielectric material, wherein the trench extends between the wiring via and the second wiring via, and wherein the conductive material filling the trench extends over an upper surface of conductive material filling the second wiring via,
wherein the trench extends over the top of the wiring via and a top of the second wiring via, and over an upper surface of the dielectric material surrounding the tops of the wiring via and the second wiring via, and wherein the conductive material filling the trench completely covers upper surfaces of the conductive material filling the wiring via and the second wiring via, and extends over the upper surface of the dielectric material surrounding the top of the wiring via and the second wiring via, and
wherein the wiring via has sidewalls at a sidewall angle greater than 85°,
further comprising:
a block material and a metal layer underlying the blocking layer and the conductive material, wherein the dielectric material is directly on and contacting the block material, and wherein the block material is directly on and contacting the metal layer; and
a second wiring via in the dielectric material,
wherein the low-k dielectric material is continuous with no etch stop layer at a line/via junction, wherein the dielectric material is an ultra low-k material, wherein the non-self-aligned via is within an optical planarization layer above the dielectric material, wherein the wiring via and the second wiring via have sidewalls at a sidewall angle greater than 85°, wherein the trench extends between the wiring via and the second wiring via, wherein the trench extends completely over the top of the wiring via and a top of the second wiring via, and over an upper surface of the dielectric material surrounding the tops of the wiring via and the second wiring via, wherein the conductive material filling the trench completely covers upper surfaces of the conductive material filling the wiring via and the second wiring via, and extends over the upper surface of the dielectric material surrounding the top of the wiring via and the second wiring via, and wherein the metal layer is one of copper and tungsten.

* * * * *

UNITED STATES PATENT AND TRADEMARK OFFICE
CERTIFICATE OF CORRECTION

Page 1 of 1

PATENT NO.         : 10,903,118 B2
APPLICATION NO.    : 16/503683
DATED              : January 26, 2021
INVENTOR(S)        : Mark L. Lenhardt et al.

It is certified that error appears in the above-identified patent and that said Letters Patent is hereby corrected as shown below:

On the Title Page

Change spelling of inventor Name: "Brown C. Peethala", to --Cornelius B. Peethala--.

Signed and Sealed this
Sixth Day of April, 2021

Drew Hirshfeld
*Performing the Functions and Duties of the
Under Secretary of Commerce for Intellectual Property and
Director of the United States Patent and Trademark Office*